United States Patent
Tang et al.

(10) Patent No.: US 6,912,699 B2
(45) Date of Patent: Jun. 28, 2005

(54) TESTING DESIGN FOR FLIP CHIP CONNECTION PROCESS

(75) Inventors: Pao Yun Tang, Tao Yuan (TW); Shao Wu Hsu, Xin Zhu (TW); Shu Ping Yang, Ji Long (TW)

(73) Assignee: HannStar Display Corp. (TW)

( * ) Notice: Subject to any disclaimer, the term of this patent is extended or adjusted under 35 U.S.C. 154(b) by 125 days.

(21) Appl. No.: 10/274,181

(22) Filed: Oct. 18, 2002

(65) Prior Publication Data

US 2004/0033636 A1 Feb. 19, 2004

(30) Foreign Application Priority Data

Aug. 14, 2002 (TW) .......................... 91118253 A

(51) Int. Cl.[7] .............................................. G06F 17/50
(52) U.S. Cl. ................. 716/4; 716/8; 716/11; 716/12
(58) Field of Search ............................ 716/4, 8, 11, 12; 327/264; 257/408

(56) References Cited

U.S. PATENT DOCUMENTS 6,492,692 B1 * 12/2002 Ishii et al. .................. 257/408
6,801,071 B1 * 10/2004 Shizuki ....................... 327/264

* cited by examiner

Primary Examiner—Thuand Do
(74) Attorney, Agent, or Firm—Morris, Manning & Martin; Tim Tingkang Xia, Esq.

(57) ABSTRACT

A testing design for flip chip connection process. In one embodiment the testing design has a substrate, a plurality of connections formed on said substrate, at least one integrated device and a plurality of bumps formed on said integrated device, wherein at least one of said bumps is electrically connected to said plurality of connectors to form an electrical channel.

19 Claims, 8 Drawing Sheets

TESTING DESIGN FOR FLIP CHIP CONNECTION PROCESS

FIELD OF THE INVENTION

The present invention relates to a testing design for chip connection process and, more particularly, to a new testing design and methods for flip chip connection process.

BACKGROUND OF THE INVENTION

With the technology developing, the image quality of LCD (Liquid Crystal Display) has been improved greatly to open up new fields such as personal electronic products in which traditional CRT display (Cathode Ray Tube display) cannot substitute for LCD. To meet the demand of portability by many products in the related fields, however, many properties, such as weight, thickness, size and low power consumption, of LCD, need to be improved.

FIG. 1 is a top view showing a conventional design for a packaged integrated circuit (IC) device 13 connecting to a PCB (printed circuit board) 11. FIG. 2 is a sectional view showing the structure along the line I–I' of FIG. 1. As shown in FIGS. 1 and 2, packaged IC device 13 has a plurality of leads 15. The designed circuit (not shown) is formed on PCB 11 with a plurality of connections 17, wherein the connectors 17 are made of exposed conductive material. The leads 15 of packaged IC device 13 are electrically connected with the connectors 17 of PCB 11 to transfer signal. However, large contact area as shown in FIG. 1 is needed to accomplish the connection between the packaged IC device 13 and PCB 11. Therefore, a conventional design for connection cannot meet the recent demand of LCD portability.

To overcome the drawbacks of conventional connection occupied large area, developing new connective technology between the flip chip and the substrate, such as the electrical connection surface of integrated circuit device is connected directly to the substrate to form an electrical channel, is developed. FIG. 3 is a top view showing a new design for flip chip connecting to glass substrate. FIG. 4 is a sectional view showing the structure along the line II–II' of FIG. 3. The designed circuit (not shown) is formed on glass substrate 21 in FIG. 4, wherein the connectors 27 are made of exposed conductive material. IC 23 has a plurality of bumps 25. Bumps 25 are electrically connected with the connectors 27 to transfer signal. As shown in FIG. 3, connection between IC 23 and glass substrate 21 only occupies the area of the size of IC 23.

After connection between IC and glass substrate, display panel can show the information depending on the signal transferred from IC. Therefore, proper alignment of the connection will improve the display quality. Thus, it is important to have proper alignment for the connection between IC and glass substrate.

However, such new connective technology between flip chip and substrate has a difficulty in process. Because one characteristic of flip chip technology is that the IC electrical bumps are connected directly down to the connections of the substrate, human eyes may not be able to assist in checking the alignment during connecting process.

FIG. 5 is a sectional view showing the structure and method of conventional testing design for flip chip connection process. The glass substrate 51 has a plurality of connectors 57, and testing IC 53 has a plurality of conductive bumps 55 and conductive lines 59 connected each of conductive bumps 55. Each of conductive bumps 55 is electrically connected with each of the connections 57 to form an electrical channel, as arrow 56 shown. However, the structure and method of conventional testing design need extra testing IC to evaluate ability of equipment and process, and the testing IC cannot be applied in liquid crystal display (TFT-LCD) product so that it will increase the cost and waste time.

Therefore, there is a need to design a structure and related methods to check alignment and resistance of each connecting point whether it meets the product specification requirement.

SUMMARY OF THE INVENTION

In one aspect, the present invention is related to a new testing design for flip chip connection process. It dose not need to change the IC specification to meet the requirement of testing circuit, and thus increases the IC application.

In another aspect, the present invention is related to a structure and method of a new testing design applied in TFT-LCD. In one embodiment, an effective testing for misalignment of bump and plane variation of pressing equipment during COG process is provided.

In yet another aspect, the present invention is related to a structure and method of a new testing design that can help LCD maker to develop easily the COG process and to design the testing quickly according to any supplied IC.

In one embodiment of the present invention, a testing design for flip chip connection process has a substrate, a plurality of connections formed on said substrate, at least one integrated device, and a plurality of bumps formed on said integrated device, wherein at least one of said bumps is electrically connected to said plurality of connectors to form an electrical channel.

These and other aspects will become apparent from the following description of the preferred embodiment taken in conjunction with the following drawings, although variations and modifications therein may be affected without departing from the spirit and scope of the novel concepts of the disclosure.

DESCRIPTION OF THE PREFERRED EMBODIMENTS

First Embodiment

Figure 1:
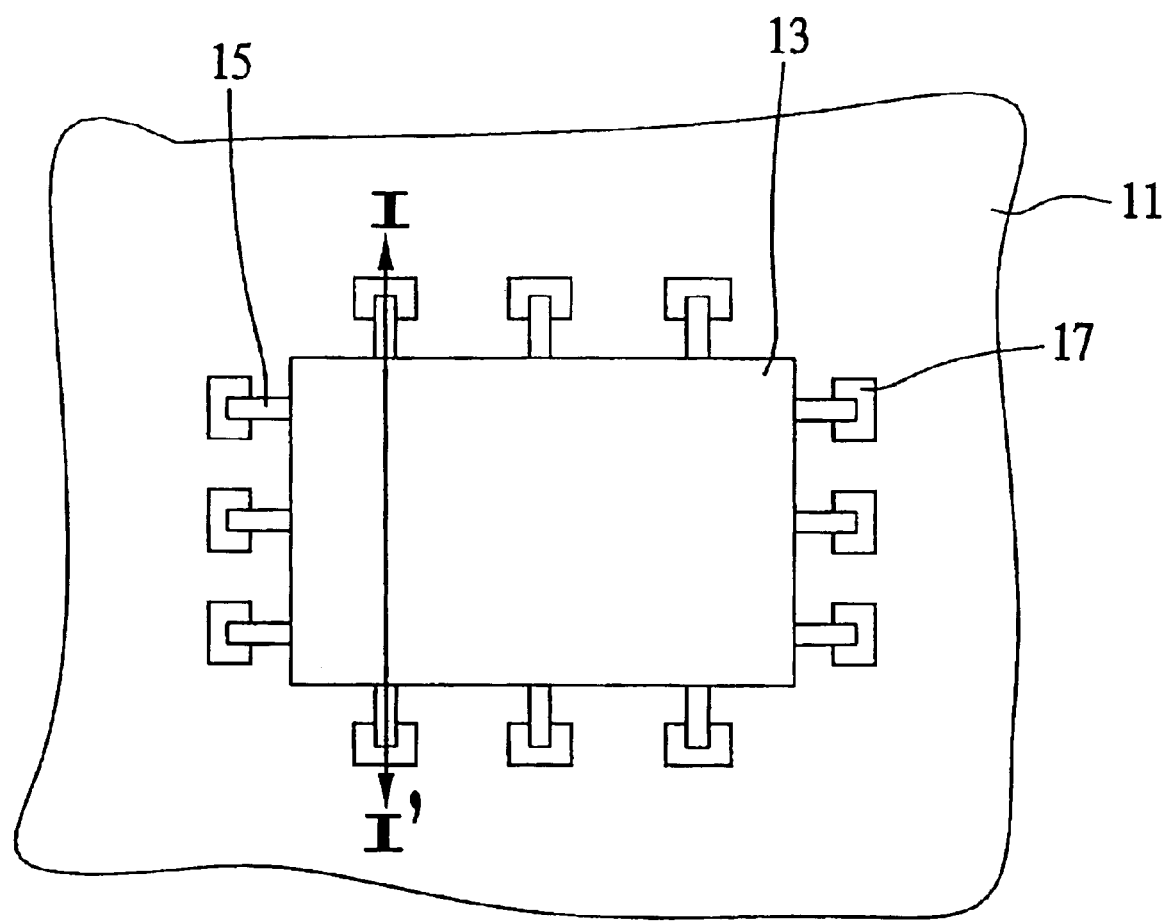
FIG. 1 is a top view showing a conventional design for packaged integrated circuit (IC) device connecting to PCB (printed circuit board).
Figure 2:
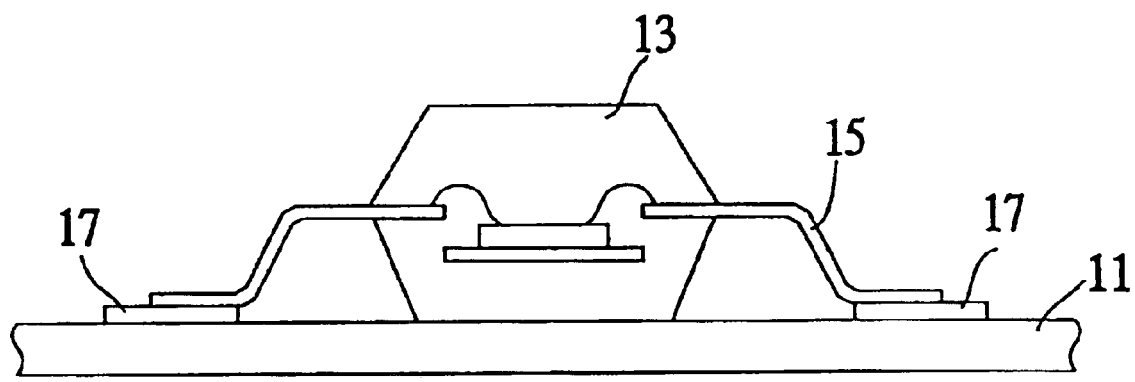
FIG. 2 is a sectional view showing the structure along the line I–I' of FIG. 1.
Figure 3:
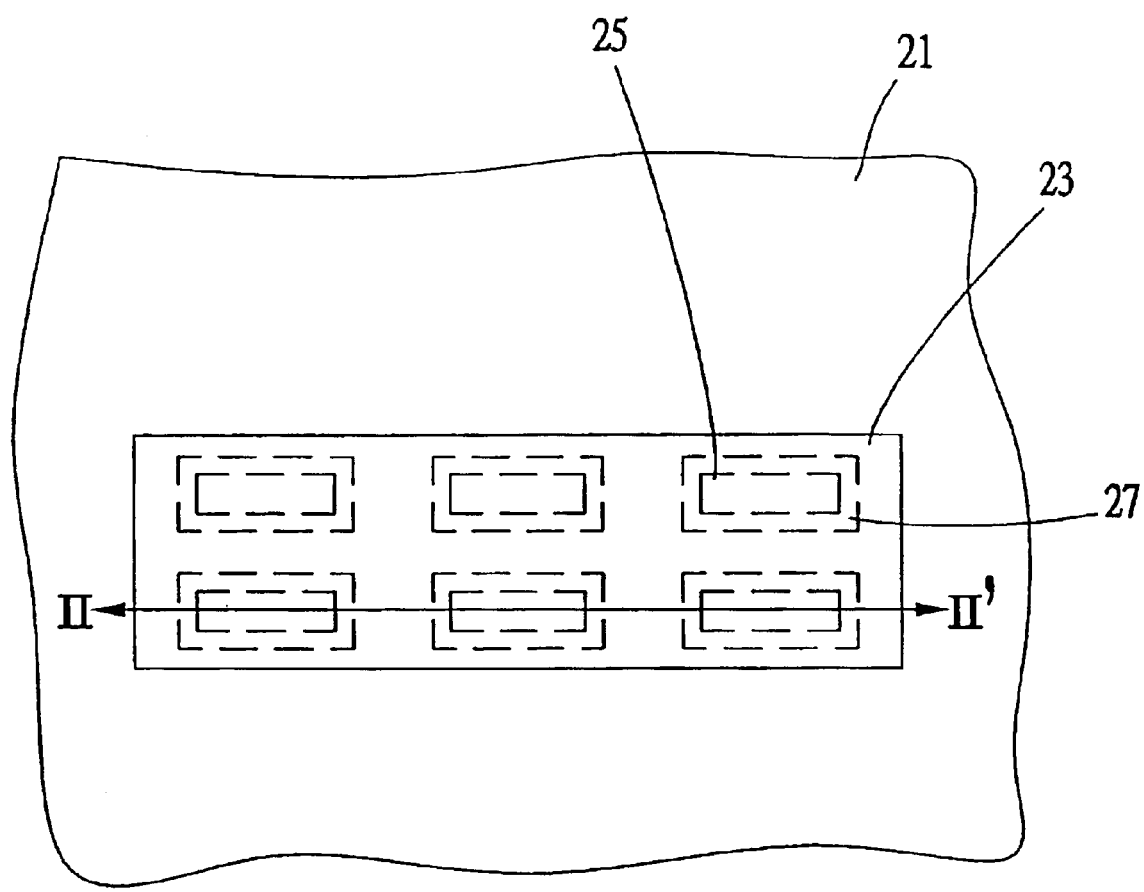
FIG. 3 is a top view showing a new design for flip chip connecting to glass substrate.
Figure 4:
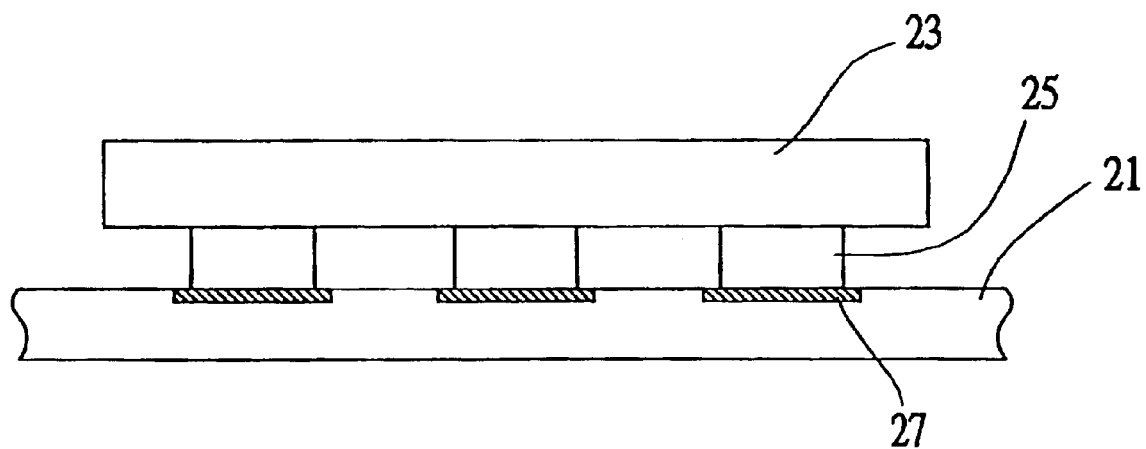
FIG. 4 is a sectional view showing the structure along the line II–II' of FIG. 3.
Figure 5:
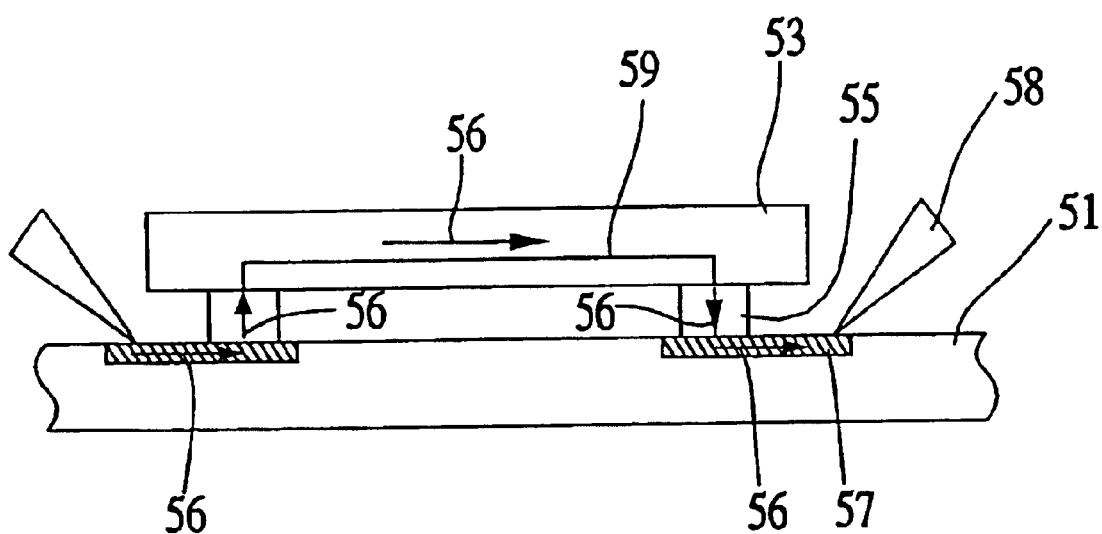
FIG. 5 is a sectional view showing the structure and method of a conventional testing design for flip chip connection process.
Figure 6:
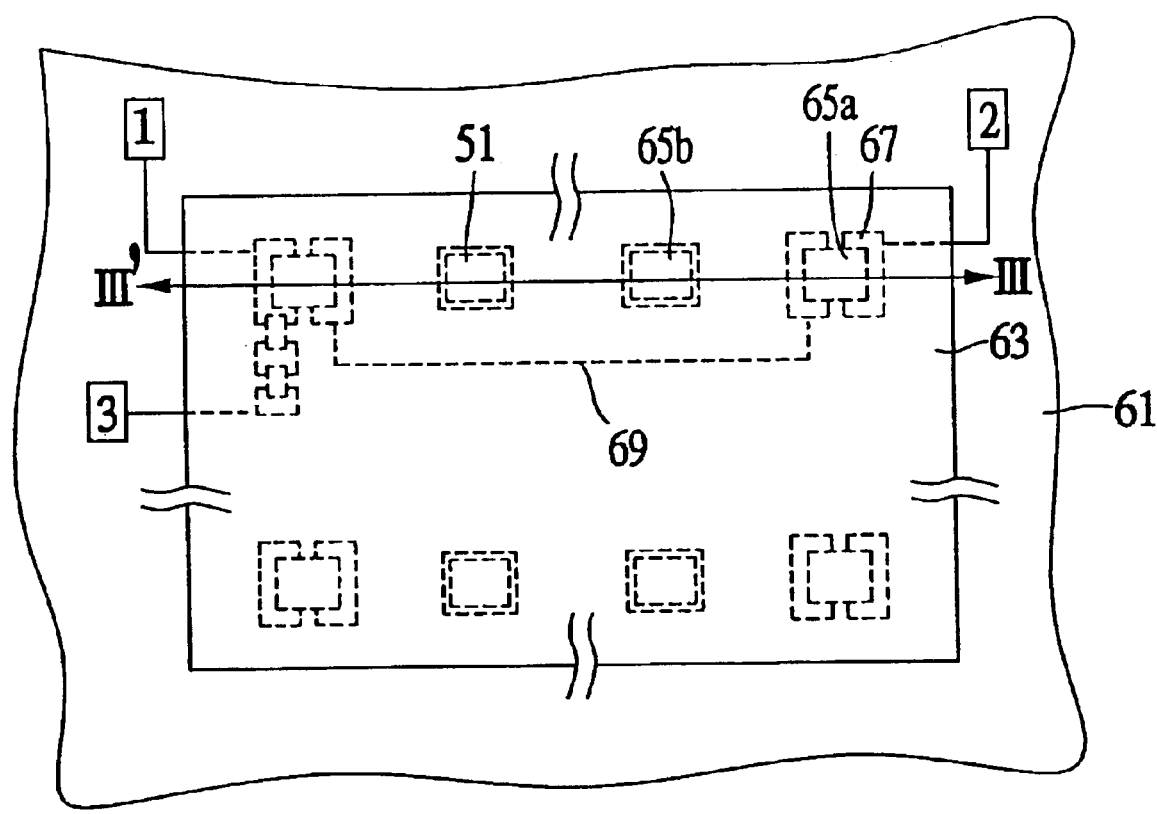
FIG. 6 is a top view showing the structure and method of a testing design for the flip chip connection process according to a first embodiment of the present invention.
Figure 7:
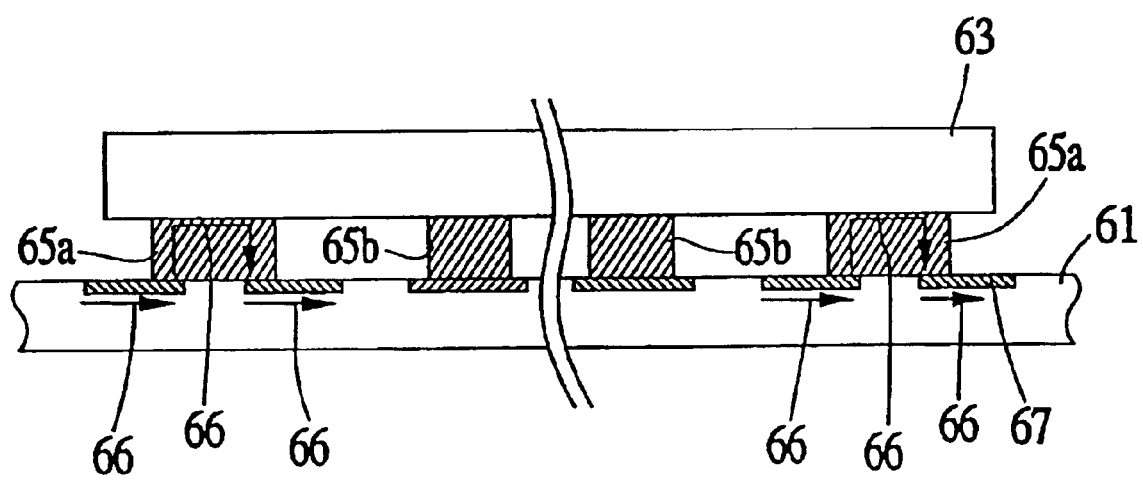
FIG. 7 is a sectional view showing the structure along the line III–III' of FIG. 6.

FIG. 6 is a top view showing the structure and method of a testing design for the flip chip connection process according to a first embodiment of the present invention. FIG. 7 is a sectional view showing the structure along the line III–III' of FIG. 6. The glass substrate 61 has a plurality of connections 67 as shown in FIG. 7, and the connectors 67 are made of conductivity material, such as aluminum, titanium, tungsten, indium tin oxide (ITO), indium zinc oxide (IZO), chromium, copper, and any combination of them thereof.

The IC 63 has a plurality of conductive bumps 65b for transferring display signal and conductive bumps 65a for testing. After COG process, each of conductive bumps 65b for transferring display signal is electrically connected with each of the connectors 67 to form an electrical channel transferring signal to panel. Each of conductive bumps 65a for testing is electrically connected with at least two of the connectors 67 to form an electrical channel, as arrows 66 shown. Therefore, IC 63 does not need to have another conductive line connected between conductive bumps 65a to form an electrical channel. It can thus lower the cost and broaden the scope of the IC applications. The conductive bumps 65a and 65b are made of conductivity material, such as aluminum, titanium, tungsten, chromium, copper, and any combination of them thereof.

To meet the process requirement, as shown in FIG. 6, display makers may form conductive lines 69 optionally on the glass substrate 61 to connect a plurality of connections 67, and dispose testing points depending on the design of conductive lines 69 and connections 67 to check the quality of long distance connection process and local connection process, such as end points of long side and those of short side of drive IC. Conductive lines 69 are made of conductivity material, such as aluminum, titanium, tungsten, indium tin oxide (ITO), indium zinc oxide (IZO), chromium, copper, and any combination of them thereof. Testing point 1 is connected to testing point 2 by conductive lines 69 to check the quality of connection process for the long side of drive IC. And testing point 1 is connected to testing point 3 for checking the quality of local connection process. When the resistance is out of the specification or appear the bias toward upper limit or lower limit, it can find out problems at an earlier stage. Therefore, it can monitor the process to keep the production yield.

Second Embodiment

Figure 8:
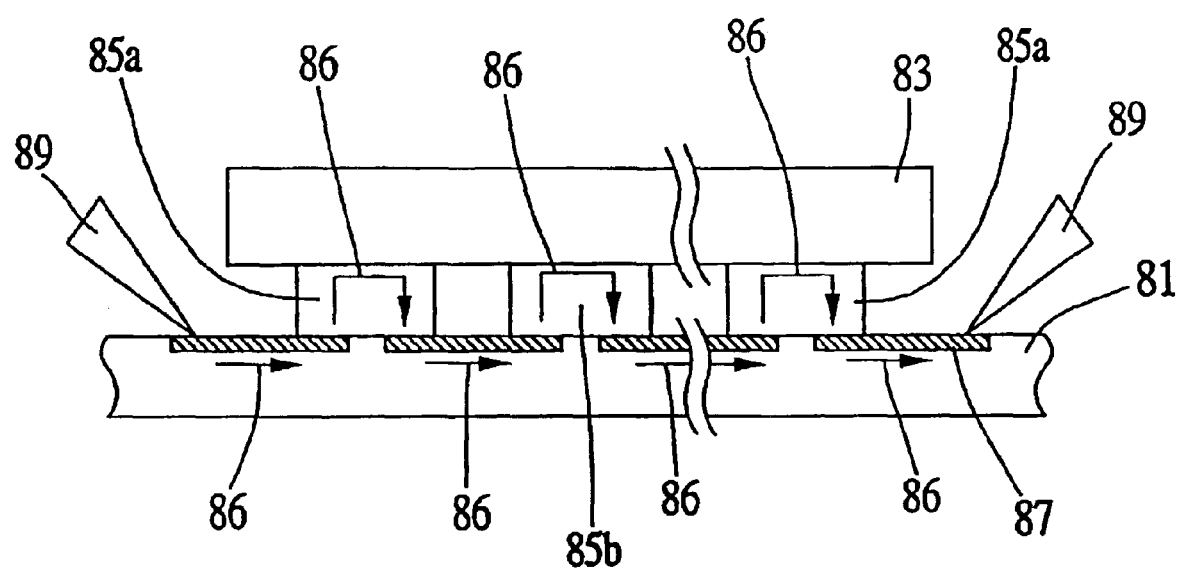
FIG. 8 is a sectional view showing the structure and method of a testing design for the flip chip connection process according to a second embodiment of the present invention.

FIG. 8 is a sectional view showing the structure and method of testing design for the flip chip connection process according to a second embodiment of the present invention. Comparing to the first embodiment of the present invention, after COG process, each of conductive bumps 85b for transferring display signal and each of conductive bumps 85a for testing is electrically connected with at least two of the connections 87 to form a electrical channel, as arrows 86 shown. Therefore, IC 83 does not need to have another conductive line. It can thus lower the cost and broaden the scope of the IC applications. It is by probe 89 to measure the resistance of the electrical channel between connecting point 1 and connecting point 2.

The design of the second embodiment of the present invention provides evaluation of technology and adjustment of process parameter for COG process before product development. Therefore, the present invention not only may shorten developing time but also can decrease cost, and it can evaluate the ability of equipment and process without designing extra testing drive IC. It increases the IC application and the ability of COG process control for display makers.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A testing design for flip chip connection process, comprising:
   a substrate;
   a plurality of connections, formed on said substrate;
   at least one integrated device having a first surface and an opposite second surface;
   a plurality of first type of bumps adapted for transferring testing signals, formed on the second surface of said at least one integrated device; and
   a plurality of second type of bumps adapted for transferring display signals, formed on the second surface of said at least one integrated device and spatially separated from said plurality of first type of bumps,
   wherein said plurality of first type of bumps and said plurality of second type of bumps, in operation, are located between the second surface of said at least one integrated device and said substrate such that at least one of said plurality of first type of bumps is electrically connected to two neighboring connections of said plurality of connections to form an electrical channel for testing for flip chip connection process; and
   wherein in operation, a testing signal passes from one of the two neighboring connections through said at least one integrated device to the other of the two neighboring connections.

2. The testing design according to claim 1, wherein said substrate is made of a non-conductivity material.

3. The testing design according to claim 2, wherein said non-conductivity material is glass or plastics.

4. The testing design according to claim 1, further comprising at least one first conductive line, formed on said substrate, to connect at least two of said plurality of connections.

5. The testing design according to claim 4, wherein at least one of said plurality of connections is a testing point.

6. The testing design according to claim 5, wherein further comprising at least one second conductive line formed on said substrate to connect one of said plurality of connections and said testing point.

7. The testing design according to claim 6, wherein said plurality of connections, said first conductive line, said second conductive line, and said testing point are made of a conductivity material.

8. The testing design according to claim 7, wherein said conductivity material is selected from a group essentially consisting of aluminum, tungsten, chromium, copper, titanium and any combination of them thereof.

9. The testing design according to claim 1, wherein said plurality of first type of bumps and said plurality of second type of bumps are made of a conductivity material.

10. The testing design according to claim 9, wherein said conductivity material is selected from a group essentially consisting of golden, lead, tin, and any combination of them thereof.

11. A testing method for flip chip connection process, comprising the steps of:
   providing a substrate;
   forming a plurality of connections, formed on said substrate;
   providing at least one integrated device having a first surface and an opposite second surface;

forming a plurality of first type of bumps adapted for transferring testing signals, formed on the second surface of said at least one integrated device; and forming a plurality of second type of bumps adapted for transferring display signals, formed on the second surface of said at least one integrated device and spatially separated from said plurality of first type of bumps, wherein said plurality of first type of bumps and said plurality of second type of bumps, in operation, are located between the second surface of said at least one integrated device and said substrate such that at least one of said plurality of first type of bumps is electrically connected to two neighboring connections of said plurality of connections to form an electrical channel for testing for flip chip connection process; and wherein in operation, a testing signal passes from one of the two neighboring connections through said at least one integrated device to the other of the two neighboring connections.

12. The testing method according to claim 11, wherein said substrate is made of a non-conductivity material.

13. The testing method according to claim 12, wherein said non-conductivity materials are glass or plastics.

14. The testing method according to claim 11, wherein further comprising the step of providing at least one first conductive line formed on said substrate to connect at least two of said plurality of connections.

15. The testing method according to claim 14, wherein at least one of said plurality of connections is a testing point.

16. The testing method according to claim 15, wherein further comprising the step of providing at least one second conductive line formed on said substrate to connect one of said plurality of connections and said testing point.

17. The testing method according to claim 16, wherein said plurality of connections, said first conductive line, said second conductive line, and said testing point are made of a conductivity material.

18. The testing method according to claim 17, wherein said conductivity material is selected from a group essentially consisting of aluminum, tungsten, chromium, copper, titanium and any combination of them thereof.

19. The testing method according to claim 11, wherein said plurality of first type of bumps and said plurality of second type of bumps are made of a conductivity material.

* * * * *